(12) United States Patent
Shigemizu et al.

(10) Patent No.: US 8,994,334 B2
(45) Date of Patent: Mar. 31, 2015

(54) BATTERY STATE-OF-CHARGE CALCULATION DEVICE

(75) Inventors: Tetsuro Shigemizu, Nagasaki (JP); Masami Iida, Nagasaki (JP); Takehiko Nishida, Nagasaki (JP); Masazumi Ohishi, Tokyo (JP); Kazuyuki Adachi, Fukuoka (JP); Shinji Murakami, Fukuoka (JP); Yoshihiro Wada, Fukuoka (JP)

(73) Assignees: Mitsubishi Heavy Industries, Ltd., Tokyo (JP); Kyushu Electric Power Co., Inc., Fukuoka-shi (JP)

(*) Notice: Subject to any disclaimer, the term of this patent is extended or adjusted under 35 U.S.C. 154(b) by 392 days.

(21) Appl. No.: 13/375,642

(22) PCT Filed: Jun. 3, 2009

(86) PCT No.: PCT/JP2009/060155
§ 371 (c)(1),
(2), (4) Date: Dec. 1, 2011

(87) PCT Pub. No.: WO2010/140233
PCT Pub. Date: Dec. 9, 2010

(65) Prior Publication Data
US 2012/0086405 A1    Apr. 12, 2012

(51) Int. Cl.
*H02J 7/00*    (2006.01)
*H02J 7/04*    (2006.01)
(Continued)

(52) U.S. Cl.
CPC ......... *G01R 31/3624* (2013.01); *H01M 10/441* (2013.01); *H01M 10/425* (2013.01);
(Continued)

(58) Field of Classification Search
USPC ......... 320/132, 134, 107, 136, 116, 129, 150, 320/161, 103, 106, 112; 324/426, 430, 429, 324/433, 441
See application file for complete search history.

(56) References Cited

U.S. PATENT DOCUMENTS 5,767,659 A * 6/1998 Farley ........................... 320/106
5,869,950 A * 2/1999 Hoffman et al. .............. 320/103
(Continued)

FOREIGN PATENT DOCUMENTS

CN    1264202 A    8/2000
CN    1864072 A    11/2006
(Continued)

OTHER PUBLICATIONS

International Search Report of PCT/JP2009/060155, mailing date Sep. 8, 2009.
(Continued)

*Primary Examiner* — Edward Tso
*Assistant Examiner* — Alexis A Boateng
(74) *Attorney, Agent, or Firm* — Westerman, Hattori, Daniels & Adrian, LLP

(57) ABSTRACT

The battery state-of-charge calculation device (100) is provided with a SOCV calculation unit (5) which outputs a first state of charge calculated based on voltage data, a SOCI calculation unit (6) which outputs a second state of charge calculated based on current data, an estimated impedance voltage calculation unit (12) which calculates an impedance voltage value based on an effective state of charge and the current data, a static determination unit (7) which determines that the impedance voltage value remains static for a predetermined time or longer in a range identified by a predetermined threshold value and outputs the determination result; and a SOC decision unit (20) which, based on the determination result, outputs the first state of charge as the effective state of charge where the impedance voltage value is static and outputs the second state of charge as the effective state of charge where the impedance voltage value is not static.

5 Claims, 2 Drawing Sheets

(51) Int. Cl.
*G01R 31/36* (2006.01)
*H01M 10/44* (2006.01)
*H01M 10/42* (2006.01)
*H01M 10/48* (2006.01)

(52) U.S. Cl.
CPC .......... *H01M10/482* (2013.01); *G01R 31/3662* (2013.01); *G01R 31/361* (2013.01); *G01R 31/3651* (2013.01)
USPC ........... 320/134; 320/132; 320/136; 320/116; 320/129; 324/426; 324/427; 324/430; 324/429

(56) References Cited

U.S. PATENT DOCUMENTS

| | | | | |
|---|---|---|---|---|
| 6,160,382 | A * | 12/2000 | Yoon et al. | 320/136 |
| 6,366,056 | B1 * | 4/2002 | Podrazhansky et al. | 320/141 |
| 7,626,394 | B2 * | 12/2009 | Kimura et al. | 324/427 |
| 7,764,049 | B2 * | 7/2010 | Iwane et al. | 320/136 |
| 8,148,994 | B2 * | 4/2012 | Yamashita et al. | 324/433 |
| 2002/0140404 | A1 * | 10/2002 | Lyden | 320/166 |
| 2006/0232277 | A1 | 10/2006 | Murakami et al. | |
| 2007/0029973 | A1 | 2/2007 | Ashizawa et al. | |
| 2007/0200567 | A1 | 8/2007 | Mizuno et al. | |
| 2008/0048662 | A1 * | 2/2008 | Hirsch et al. | 324/430 |
| 2008/0278115 | A1 * | 11/2008 | Huggins | 320/134 |
| 2009/0027007 | A1 * | 1/2009 | Iwane et al. | 320/129 |

FOREIGN PATENT DOCUMENTS

| | | |
|---|---|---|
| CN | 101198922 A | 6/2008 |
| EP | 1 353 191 A2 | 10/2003 |
| EP | 1674877 A1 | 6/2006 |
| EP | 1701175 A2 | 9/2006 |
| EP | 1707974 A1 | 10/2006 |
| JP | 2006-058114 A | 3/2006 |
| JP | 3767150 B2 | 4/2006 |
| KR | 10-2004-0014922 A | 2/2004 |
| KR | 10-2004-0065997 A | 7/2004 |
| KR | 10-2004-0068117 A | 7/2004 |
| WO | 2006/058970 A1 | 6/2006 |
| WO | 2008/026476 A1 | 3/2008 |

OTHER PUBLICATIONS

Written Opinion of PCT/JP2009/060155, mailing date Sep. 8, 2009.
Chinese Office Action dated Aug. 23, 2013, issued in corresponding Chinese Patent Application No. 200980159607.1, w/English translation.
Korean Office Action dated Feb. 25, 2013, issued in corresponding Korean Patent Application No. 10-2011-7030024; with English translation (3 pages).
European Search Report dated Jun. 16, 2014, issued in European Patent Application No. 09845518.1 (3 pages).

* cited by examiner

US 8,994,334 B2

BATTERY STATE-OF-CHARGE CALCULATION DEVICE

TECHNICAL FIELD

The present invention relates to a battery state-of-charge calculation device for calculating the state of charge of a battery.

BACKGROUND ART OF THE INVENTION

In recent years, further improvements have been expected in the performance of rechargeable batteries used in fuel cell electric vehicle and a hybrid vehicle. Therefore, in order to prevent overcharge and overdischarge of rechargeable batteries and improve the cycle life thereof, techniques for accurately calculating the state of charge (hereinafter, referred to as SOC) of the battery are required.

Hereinafter, SOC which is calculated on the basis of current value is referred to as SOCI, while SOC which is calculated on the basis of voltage value is referred to as SOCV. A conventional battery state-of-charge calculation device integrates a value of electric current charged and discharged so as to calculate SOCI, which is given as the SOC of the battery. However, measurement errors of the value of electric current are gradually accumulated in SOCI because the value of electric current is integrated. Therefore, a problem of SOCI deviating from actual SOC is arisen.

Therefore, in a conventional battery state-of-charge calculation device, first, SOCI is used as SOC and thereafter, SOCV which is calculated on a timely basis is used as SOC in place of SOCI to correct SOC. For example, in the battery state-of-charge calculation device disclosed in Patent Document 1, upon detecting switchover from charge to discharge in a battery and vice versa, change in voltage values resulting from internal resistance of the battery (hereinafter, referred to as estimated impedance voltage value) is calculated from an actually measured current value and an actually measured voltage value, and an estimated no-load voltage value is calculated from the estimated impedance voltage value and the actually measured voltage value. Upon detecting switchover from charge to discharge in a battery and vice versa, the device of Patent Document 1 choices one of SOCV based on the thus calculated estimated no-load voltage value and SOCI based on an integrated current value, and the device uses the chosen one as SOC.

Further, in the battery state-of-charge calculation device disclosed in Patent Document 2, an estimated impedance voltage based on an actually measured temperature and an actually measured current value of a battery is subtracted from an actually measured voltage value, thereby resulting in an estimated no-load voltage value. The device of Patent Document 2 calculates SOC using SOCV on the basis of the thus calculated estimated no-load voltage value, along with SOCI on the basis of an integrated current value.

PRIOR ART DOCUMENT

Patent Document

Patent Document 1: Japanese Patent No. 3767150
Patent Document 2: Japanese Published Unexamined Patent Application No. 2006-58114

DETAILED DESCRIPTION OF THE INVENTION

Problems to be Solved by the Invention

As described above, an estimated impedance voltage value used in calculation of SOC is known to be larger in error which is contained as an absolute value of the estimated impedance voltage value becomes larger. However, in the battery state-of-charge calculation device disclosed in Patent Document 1, SOC of a battery is determined irrespective of an absolute value of an estimated impedance voltage value. Thus, SOCV is calculated based on an estimated impedance voltage value containing a large error, and if SOC is calculated based on the SOCV, the SOC may be inaccurate.

Also, in the battery state-of-charge calculation device disclosed in Patent Document 2, where an actually measured temperature of a battery and an actually measured current value are low in accuracy of measurement, SOCV is calculated based on an estimated impedance voltage value containing a large error, and if SOC is calculated based on the SOCV, the SOC may be inaccurate.

As described so far, a conventional battery state-of-charge calculation device is unable to determine that an error contained in an estimated impedance voltage value is made small and is therefore unable to determine the accuracy of the calculation of SOCV.

The present invention has been made in view of the above situation, an object of which is to provide a battery state-of-charge calculation device capable of accurately calculating SOC.

Means for Solving the Problem

The present invention has been made for solving the above problem and is a battery state-of-charge calculation device which is provided with a first state-of-charge calculation unit which outputs a first state of charge calculated based on voltage data, a second state-of-charge calculation unit which outputs a second state of charge calculated based on current data, an impedance voltage calculation unit which calculates an impedance voltage value based on an effective state of charge, temperature data and the current data, a static determination unit which determines that the impedance voltage value remains static for a predetermined time or longer in a range identified by a predetermined threshold value value and outputs the determination result, and a state-of-charge decision unit which, on the basis of the determination result, outputs the first state of charge as the effective state of charge where the impedance voltage value is static and outputs the second state of charge as the effective state of charge where the impedance voltage value is not static.

In the battery state-of-charge calculation device of the present invention, the second state-of-charge calculation unit may integrate the current data, with the first state of charge given as an initial value or with the effective state of charge in which a former value is held given as an initial value, thereby calculating the second state of charge.

In the battery state-of-charge calculation device of the present invention, the static determination unit may calculate a period of time during which the impedance voltage value is static, thereby determining that the impedance voltage value is static where the static time is equal to or longer than a predetermined time.

In the battery state-of-charge calculation device of the present invention, the first state-of-charge calculation unit may calculate the first state of charge from a no-load voltage value based on the voltage data and the impedance voltage value.

In the battery state-of-charge calculation device of the present invention, the state-of-charge decision unit may output the first state of charge as the effective state of charge where the difference between the first state of charge and the second state of charge is equal to or more than a predetermined threshold value.

In the battery state-of-charge calculation device of the present invention, the impedance voltage calculation unit may calculate an impedance voltage value on the basis of an effective state of charge, the current data, and the temperature data.

Effect of the Invention

According to the present invention, the battery state-of-charge calculation device judges that an estimated impedance voltage value is static and uses SOCV based on an estimated impedance voltage value having a smaller error as SOC in place of SOCI in which errors are accumulated. Therefore, it is possible to obtain SOC accurately.

Further, since the battery state-of-charge calculation device calculates SOC accurately, it is possible to prevent overcharge and overdischarge of a battery. Still further, in a rechargeable battery in which SOC is causally related to cycle life, the battery state-of-charge calculation device is able to improve the life cycle of the battery.

MODE FOR CARRYING OUT THE INVENTION

First Embodiment

Figure 1:
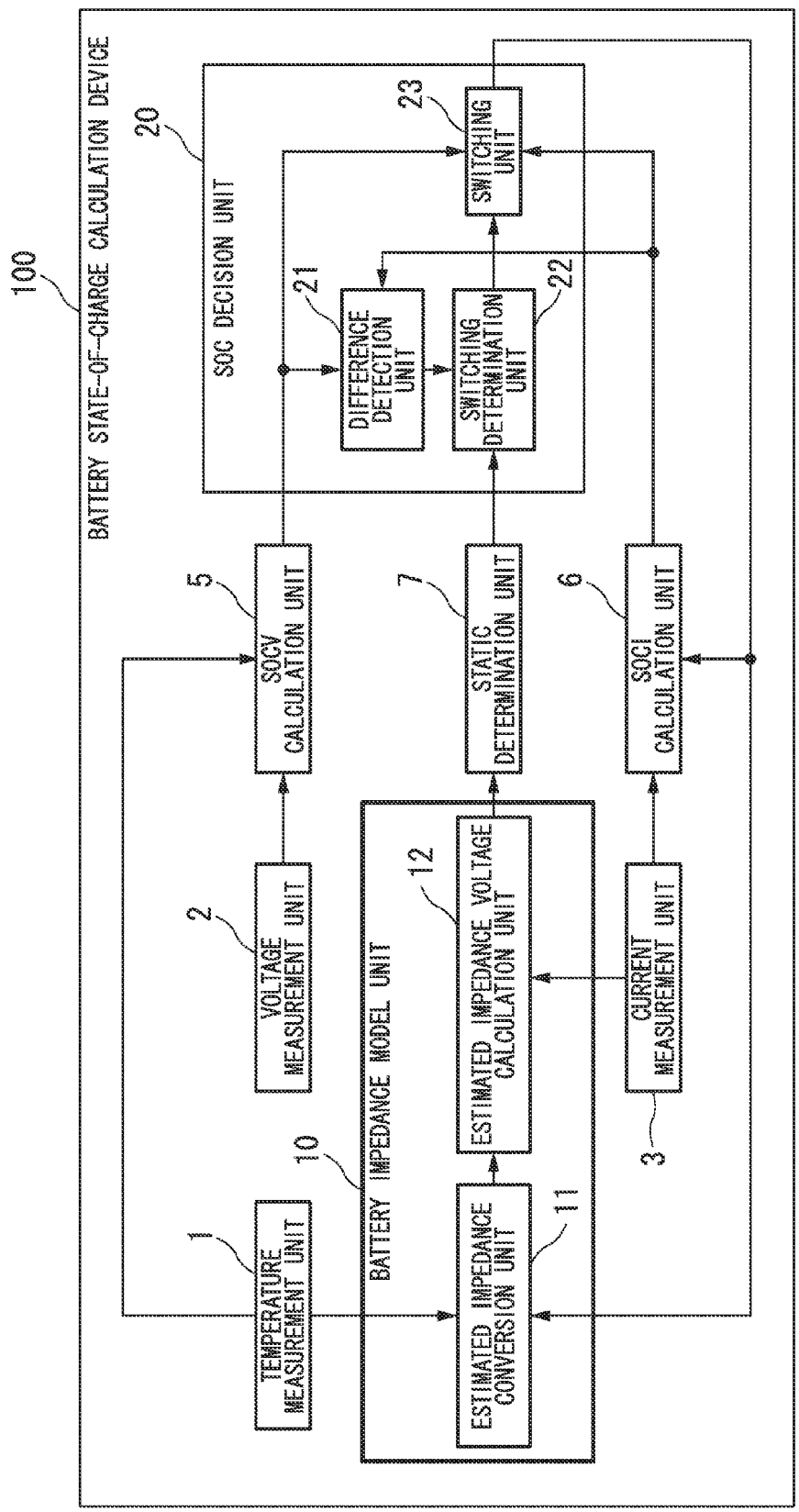
FIG. 1 is a drawing which shows a constitution of a battery state-of-charge calculation device of a first embodiment in the present invention.

An explanation will be made for the first embodiment for carrying out the present invention. FIG. 1 is a drawing which shows the constitution of a battery state-of-charge calculation device of the first embodiment in the present invention. In FIG. 1, the battery state-of-charge calculation device 100 is provided with a temperature measurement unit 1, a voltage measurement unit 2, a current measurement unit 3, a SOCV calculation unit 5, a SOCI calculation unit 6, a static determination unit 7, a battery impedance model unit 10, and a SOC decision unit 20.

The temperature measurement unit 1 measures a temperature of a rechargeable battery (not illustrated) to output temperature data at a predetermined cycle. The voltage measurement unit 2 measures a voltage of the rechargeable battery (not illustrated) to output voltage data at a predetermined cycle. The current measurement unit 3 measures current output from the rechargeable battery (not illustrated) to output current data at a predetermined cycle.

The battery impedance model unit 10 outputs estimated impedance voltage data on the basis of SOC data (effective state-of-charge) output from a switching unit 23 of the SOC decision unit 20 to be described later and the temperature data. The battery impedance model unit 10 is provided with an estimated impedance conversion unit 11 and an estimated impedance voltage calculation unit 12.

The estimated impedance conversion unit 11 selects estimated impedance from a conversion table (not illustrated) on the basis of the SOC data and the temperature data, thereby outputting estimated impedance data. In this case, the conversion table (not illustrated) is prepared by actually measuring a relationship between the SOC data, the temperature data and the estimated impedance in advance. The estimated impedance voltage calculation unit 12 calculates an estimated impedance voltage value by multiplying the estimated impedance data with the current data, outputting the estimated impedance voltage value as estimated impedance voltage data at a predetermined cycle.

The SOCV calculation unit 5 calculates SOCV on the basis of the temperature data and the voltage data and outputs the thus obtained SOCV as SOCV data. In this case, the voltage data is input from the voltage measurement unit 2 to the SOCV calculation unit 5.

The SOCI calculation unit 6 calculates SOCI by adding an integrated value of current data to SOC data output from the switching unit 23 of the SOC decision unit 20 to be described later. In this case, where SOCV data is output from the switching unit 23 as SOC data, SOCI is reset by the SOCV data. That is, the SOCI calculation unit 6 adds an integrated value of the current data to SOCI which has been reset, thereby outputting the thus obtained SOCI as SOCI data.

The static determination unit 7 obtains the estimated impedance voltage data at a predetermined cycle, thereby measuring a period of time during which an estimated impedance voltage value is within a range identified by a predetermined threshold value (hereinafter, referred to as static time). In this case, the absolute value of the predetermined threshold value is also sufficiently small. Therefore, where an absolute value of the estimated impedance voltage value is sufficiently small, an error contained in the estimated impedance voltage value is also small. Further, where an error contained in the estimated impedance voltage value is small, the voltage data is to be substantially equal to an estimated no-load voltage value.

Where the estimated impedance voltage value is out of the range identified by the predetermined threshold value, the static determination unit 7 resets a measurement result of static time to a value of zero. Further, where the estimated impedance voltage value is out of the range identified by the predetermined threshold value, the static determination unit 7 resumes to measure the static time. The static determination unit 7 outputs a static signal which indicates that the estimated impedance voltage value is made static where the static time is equal to or more than a predetermined time and does not otherwise output the static signal.

The SOC decision unit 20 makes SOC effective by the procedures to be described later, thereby outputting SOC data. The SOC decision unit 20 is provided with a difference detection unit 21, a switching determination unit 22 and a switching unit 23. The difference detection unit 21 obtains SOCV data and SOCI data, thereby calculating a difference between the SOCV data and the SOCI data as SOC difference data. The difference detection unit 21 notifies the switching determination unit 22 of the SOCV data output from the SOCV calculation unit 5.

The difference detection unit 21 outputs a difference determination signal where the absolute value of the SOC difference data is equal to or more than a predetermined range and does not otherwise output the difference determination signal. In this case, it is also acceptable that the predetermined range is zero, by which the difference detection unit 21 continues constant output of the difference determination signal. In this case, the switching determination unit 22 to be described later constantly outputs a SOC switching signal when the static signal is input.

Until being notified by the difference detection unit 21 that SOCV data has been output from the SOCV calculation unit 5, the switching determination unit 22 outputs a SOC switching signal. After being notified, where both the static signal and the difference determination signal are input, the switching determination unit 22 outputs the SOC switching signal. Otherwise, the switching determination unit 22 does not output the SOC switching signal.

The switching unit 23 obtains SOCV data, SOCI data and a SOC switching signal respectively from the SOCV calculation unit 5, the SOCI calculation unit 6 and the switching determination unit 22. Where the SOC switching signal is input, the switching unit 23 outputs the SOCV data input from the SOCV calculation unit 5 as SOC data (effective state of charge). Otherwise, the switching unit 23 outputs the SOCI data input from the SOCI calculation unit 6 as SOC data (effective state of charge).

Next, an explanation will be made for the motion of the battery state-of-charge calculation device 100. The temperature measurement unit 1 measures a temperature of a rechargeable battery (not illustrated) and outputs temperature data. The voltage measurement unit 2 measures a voltage of the rechargeable battery (not illustrated) and outputs voltage data. The current measurement unit 3 measures a current output from the rechargeable battery (not illustrated) and outputs current data.

Further, the SOCV calculation unit 5 calculates SOCV on the basis of the temperature data and the voltage data and outputs SOCV data to the difference detection unit 21 and the switching unit 23.

On the other hand, since the switching determination unit 22 is not notified by the difference detection unit 21 of the SOCV data output from the SOCV calculation unit 5, the switching determination unit 22 outputs a SOC switching signal. Since the SOC switching signal has been input, the switching unit 23 outputs the SOCV data input from the SOCV calculation unit 5 to the SOCI calculation unit 6 and the estimated impedance conversion unit 11.

Next, the difference detection unit 21 notifies the switching determination unit 22 of the SOCV data output from the SOCV calculation unit 5. Therefore, the switching determination unit 22 stops output of the SOC switching signal. The SOCI calculation unit 6 adds an integrated value of the current data to the SOC data obtained as an initial value, thereby calculating SOCI. Further, the SOCI calculation unit 6 outputs the thus obtained SOCI as SOCI data to the difference detection unit 21 and the switching unit 23.

The SOCI data is initialized by the SOCV data, by which the SOC difference data is to be a value of zero. Therefore, the difference detection unit 21 does not output a difference determination signal. As a result, the switching unit 23 outputs the SOCI data to the SOCI calculation unit 6 and the estimated impedance conversion unit 11 as SOC data.

Next, the estimated impedance conversion unit 11 selects estimated impedance from the conversion table (not illustrated) on the basis of the SOC data input from the switching unit 23 and the temperature data input from the temperature measurement unit 1, thereby outputting the estimated impedance as estimated impedance data. The estimated impedance voltage calculation unit 12 multiplies the estimated impedance data with the current data to calculate an estimated impedance voltage value, thereby outputting an estimated impedance voltage value.

Next, the static determination unit 7 obtains the estimated impedance voltage value and starts to measure the static time. In this case, immediately after the static determination unit 7 starts to measure the static time, the static time is not yet equal to or more than a predetermined time. Therefore, the static determination unit 7 does not output a static signal.

Next, suppose that current values are integrated to accumulate errors at SOCI and the absolute value of the SOC difference data is within or greater than a predetermined range. As a result, the difference detection unit 21 outputs a difference determination signal. On the other hand, suppose that the static time is not within or greater than a predetermined time. Therefore, the switching determination unit 22 does not output a SOC switching signal.

Next, suppose that the static time is equal to or more than a predetermined time. Therefore, the static determination unit 7 outputs a static signal. Now, since both the static signal and the difference determination signal are input, the switching determination unit 22 outputs a SOC switching signal. Further, the switching unit 23 outputs SOCV data as SOC data. Therefore, SOCI is reset by the SOCV data which is the SOC data. The SOCI calculation unit 6 outputs the thus obtained SOCI as SOCI data to the difference detection unit 21 and the switching unit 23.

Next, the difference detection unit 21 obtains the SOCV data and the SOCI data, thereby calculating SOC difference data as a difference between the SOCV data and SOCI data. In this case, since the SOCI data is initialized by the SOCV data, the SOC difference data is a value of zero. Therefore, the difference detection unit 21 does not output a difference determination signal. As a result, the switching unit 23 outputs the SOCI data as the SOC data to the SOCI calculation unit 6 and the estimated impedance conversion unit 11.

Next, for the sake of explanation, suppose that an estimated impedance voltage value is out of a range identified by a predetermined threshold value. As a result, the static determination unit 7 stops output of a static signal and resets the measurement result of static time to be a value of zero. Further, suppose that the estimated impedance voltage value is again within a range from out of the range identified by the predetermined threshold value. Therefore, the static determination unit 7 resumes measurement of the static time. Subsequently, each block repeats the above-described motion, by which the SOC decision unit 20 determines the SOC and outputs SOC data.

As described so far, according to the first embodiment of the present invention, the battery state-of-charge calculation device 100 determines that an estimated impedance voltage value is made static and uses SOCV based on an estimated impedance voltage value having a smaller error as SOC in place of SOCI having accumulated errors. It is, therefore, possible to obtain SOC accurately.

Second Embodiment

Figure 2:
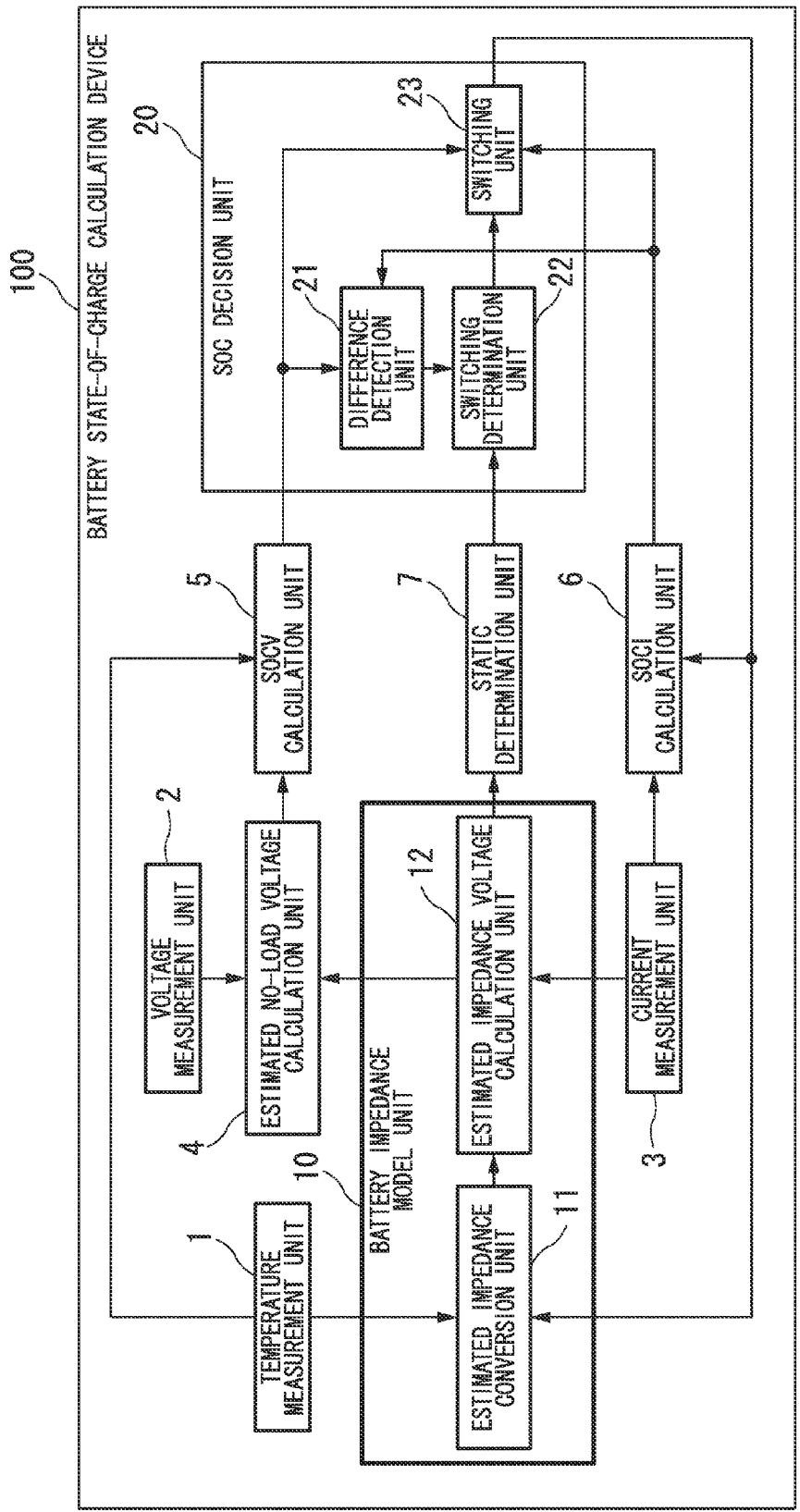
FIG. 2 is a drawing which shows a constitution of a battery state-of-charge calculation device of a second embodiment in the present invention.

An explanation will be made for a second embodiment for carrying out the present invention. FIG. 2 shows a drawing which shows a constitution of a battery state-of-charge calculation device of the second embodiment in the present invention. In FIG. 2, the battery state-of-charge calculation device 100 is provided with an estimated no-load voltage calculation unit 4, in addition to the constitution of the battery state-of-charge calculation device 100 of the first embodiment.

The estimated no-load voltage calculation unit 4 obtains voltage data and an estimated impedance voltage value, subtracting the estimated impedance voltage value from the voltage data, thereby calculating an estimated no-load voltage value. The estimated no-load voltage calculation unit 4 outputs the estimated no-load voltage value to the SOCV calculation unit 5. The SOCV calculation unit 5 obtains the estimated no-load voltage value from the estimated no-load voltage calculation unit 4 in place of the voltage data.

The SOCV calculation unit 5 calculates SOCV on the basis of the temperature data and the estimated no-load voltage value and outputs the thus obtained SOCV as SOCV data to the difference detection unit 21 and the switching unit 23.

Since the estimated no-load voltage calculation unit 4 is additionally provided, the second embodiment is complicated in constitution as compared with the first embodiment. However, the SOCV calculation unit 5 of the second embodiment calculates SOCV on the basis of an estimated no-load voltage value, with an estimated impedance voltage value taken into account. Therefore, the second embodiment is able to calculate SOCV more accurately than in the first embodiment. As a result, the battery state-of-charge calculation device 100 is able to obtain SOC more accurately.

As described so far, according to the embodiments of the present invention, the battery state-of-charge calculation device 100 judges that an estimated impedance voltage value is made static and uses SOCV on the basis of the estimated impedance voltage value having a smaller error as SOC in place of SOCI having accumulated errors. It is, therefore, possible to obtain SOC accurately.

Further, since the battery state-of-charge calculation device accurately calculates SOC, it is possible to prevent overcharge and overdischarge of a battery. Still further, in a rechargeable battery in which SOC is causally related to cycle life, the battery state-of-charge calculation device is able to improve the life cycle of the battery.

An explanation has been made so far in detail for the embodiments of the present invention by referring to the drawings. The constitution of the present invention given herein is for explanatory purpose, and the present invention is not to be considered limited thereto, and various designs and constitutions may be used as long as they are within the scope of the claims listed herein.

For example, the SOCI calculation unit 6 may keep the SOCI data in which a former value is held, and may calculate SOCI by integrating the current data, with the previous SOCI data given as an initial value, and then the unit 6 may output the SOCI as the SOCI data. Further, the static determination unit 7 may output data "which is made static" as a static signal where a static time is equal to or longer than a predetermined time and, otherwise, may output data "which is not yet made static."

Further, for example, the difference detection unit 21 may output data "which is out of a range" as a difference determination signal, where an absolute value of the SOC difference data is equal to or more than a predetermined threshold value, otherwise it may output data "which is within a range." Still further, the switching determination unit 22 may output a SOC switching signal only where a difference determination signal is data "which is out of a range" and also a static signal is data "which is made static." In addition, the estimated impedance conversion unit 11 may keep the SOC data in which a former value is held, and may select estimated impedance, with the previously input SOC data given as an initial value.

Still further, the battery state-of-charge calculation device described in the present invention corresponds to the battery state-of-charge calculation device 100; the first state-of-charge calculation unit corresponds to the SOCV calculation unit 5; the second state-of-charge calculation unit corresponds to the SOCI calculation unit 6; the impedance voltage calculation unit corresponds to the battery impedance model unit 10, the estimated impedance conversion unit 11 and the estimated impedance calculation unit 12; the static determination unit corresponds to the static determination unit 7; and the state-of-charge decision unit corresponds to the SOC decision unit 20, the difference detection unit 21, the switching determination unit 22 and the switching unit 23.

INDUSTRIAL APPLICABILITY

According to the above-described embodiments, the battery state-of-charge calculation device 100 determines that an estimated impedance voltage value is made static and uses SOCV based on an estimated impedance voltage value including a smaller error as SOC in place of SOCI including accumulated errors. Therefore, it is possible to obtain SOC accurately. The present invention is favorably applicable to a battery state-of-charge calculation device.

DESCRIPTION OF REFERENCE SYMBOLS

1: Temperature measurement unit
2: Voltage measurement unit
3: Current measurement unit
4: Estimated no-load voltage calculation unit
5: SOCV calculation unit
6: SOCI calculation unit
7: Static determination unit
10: Battery impedance model unit
11: Estimated impedance conversion unit
12: Estimated impedance calculation unit
20: SOC decision unit
21: Difference detection unit
22: Switching determination unit
23: Switching unit
100: Battery state-of-charge calculation device

The invention claimed is:

1. A battery state-of-charge calculation device, comprising:
   a first state-of-charge calculation unit which outputs a first state of charge calculated on the basis of voltage data;
   a second state-of-charge calculation unit which outputs a second state of charge calculated on the basis of current data;
   an impedance voltage calculation unit which calculates an impedance voltage value on the basis of an effective state of charge and the current data;
   a static determination unit which obtains the impedance voltage value at a predetermined cycle, thereby measuring a period of time during which the impedance voltage value is within a range identified by a predetermined threshold value, and determines that the impedance voltage value is static where a static time is equal to or longer than a predetermined time in the range identified by the predetermined threshold value and outputs the determination result; and
   a state-of-charge decision unit which, on the basis of the determination result, outputs the first state of charge as the effective state of charge where the impedance voltage value is static and outputs the second state of charge as the effective state of charge where the impedance voltage value is not static.

2. The battery state-of-charge calculation device according to claim 1, wherein the second state-of-charge calculation unit integrates the current data, with the first state of charge given as an initial value or with the effective state of charge in which a former value is held given as an initial value, thereby calculating the second state of charge.

3. The battery state-of-charge calculation device according to claim 1, wherein the first state-of-charge calculation unit calculates the first state of charge from a no-load voltage value based on the voltage data and the impedance voltage value.

4. The battery state-of-charge calculation device according to claim 1, wherein the state-of-charge decision unit outputs the first state of charge as the effective state of charge where a difference between the first state of charge and the second state of charge is equal to or more than a predetermined threshold value.

5. The battery state-of-charge calculation device according to claim 1, wherein the impedance voltage calculation unit calculates an impedance voltage value on the basis of the effective state of charge, the current data and the temperature data.

* * * * *